(12) United States Patent
Lawler et al.

(10) Patent No.: US 6,882,206 B2
(45) Date of Patent: Apr. 19, 2005

(54) ENABLING METHOD TO PREVENT GLITCHES IN WAVEFORM OF ARBITRARY PHASE

(75) Inventors: Edward P. Lawler, Fairport, NY (US); David Charneski, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/426,263

(22) Filed: Apr. 30, 2003

(65) Prior Publication Data

US 2004/0217796 A1 Nov. 4, 2004

(51) Int. Cl.[7] .................................................. G06F 1/04
(52) U.S. Cl. ........................ 327/291; 327/327; 327/294
(58) Field of Search ................................. 327/291, 164, 327/293, 565

(56) References Cited

U.S. PATENT DOCUMENTS

| | | | | |
|---|---|---|---|---|
| 5,574,753 A | * | 11/1996 | Vartti et al. ................. | 375/357 |
| 5,627,795 A | * | 5/1997 | Nitta .......................... | 365/233 |
| 5,652,536 A | * | 7/1997 | Nookala et al. ............ | 327/298 |
| 5,808,486 A | * | 9/1998 | Smiley ....................... | 327/34 |

FOREIGN PATENT DOCUMENTS

EP     1 077 529 A1     2/2001

* cited by examiner

*Primary Examiner*—Dinh T. Le
(74) *Attorney, Agent, or Firm*—Peyton C. Watkins

(57) ABSTRACT

The present invention includes a system that has been developed to vary the starting and stopping of a pulse train of arbitrary phase without glitches, spurious pulses, or spurious change in duty cycle. This is accomplished by a system for generating a gated periodic waveform, the system includes a generator for generating a periodic waveform of adjustable phase; a device for providing a delayed enable signal based on the phase of the periodic waveform so that the gated periodic waveform can be started and stopped without creating undesirable changes in the gated periodic waveform; and a logic element for generating a gated periodic waveform based on the delayed enable signal and the periodic waveform of adjustable phase.

10 Claims, 4 Drawing Sheets

ENABLING METHOD TO PREVENT GLITCHES IN WAVEFORM OF ARBITRARY PHASE

FIELD OF THE INVENTION

This invention relates generally to electronic imaging systems and, more particularly, to starting and stopping critical systems clocks without creating glitches or spurious pulses.

BACKGROUND OF THE INVENTION

A series of logic-level pulses can typically be created by performing a logical AND of a continuously running pulse train with a positive logic enable signal. To avoid shortened pulses or glitches at turn-on or turn-off, the enable signal should transition from low to high and high to low when the pulse train is low.

If the phase of the continuously running pulse train is varied, the phase of the enable signal must be varied accordingly. However, the enable signal is typically generated by logic running from a non-adjustable system clock of fixed phase. Consequently, a mechanism is needed for varying the phase of the enable signal so that shortened pulses or glitches are not created.

SUMMARY OF THE INVENTION

The present invention is directed to providing a mechanism for varying the phase of the enable signal. Briefly summarized, according to one aspect of the present invention, the invention includes a system for generating a gated periodic waveform, the system includes (a) a generator for generating a periodic waveform of adjustable phase; (b) a device for providing a delayed enable signal based on the phase of the periodic waveform so that the gated periodic waveform can be started and stopped without creating undesirable changes in the gated periodic waveform; and (c) a logic element for generating a gated periodic waveform based on the delayed enable signal and the periodic waveform of adjustable phase.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 1:
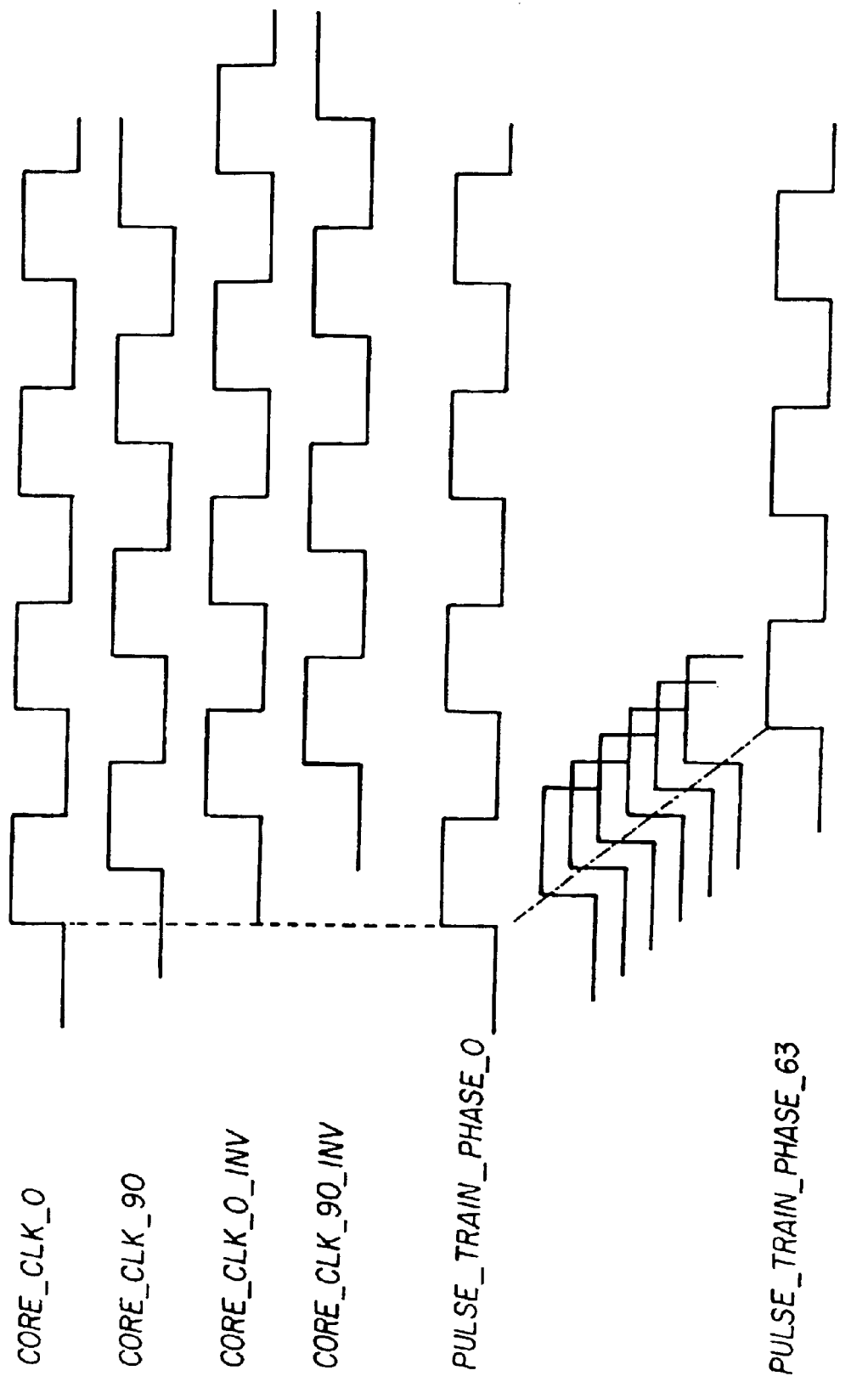
FIG. 1 is a timing diagram showing the various clocks and phases used in the present invention.

In FIG. 1 are shown four 'core clock' phases each having a 90-degree phase separation. These core clocks are used as inputs to an enable delay logic 10 shown in FIG. 2. Also shown in FIG. 1 are 64 free running clock phases, "PULSE_TRAIN_PHASE_0" through "PULSE_TRAIN_PHASE_63", where "PULSE_TRAIN_PHASE_0" is phase aligned with the "CORE_CLK_0", and each successive phase of "PULSE_TRAIN_PHASE_0" through "PULSE_TRAIN_PHASE_63" is shifted by $1/64^{th}$ of the clock period from the previous phase. These will be used as inputs to a multiplexer 20 shown in FIG. 2.

Figure 2:
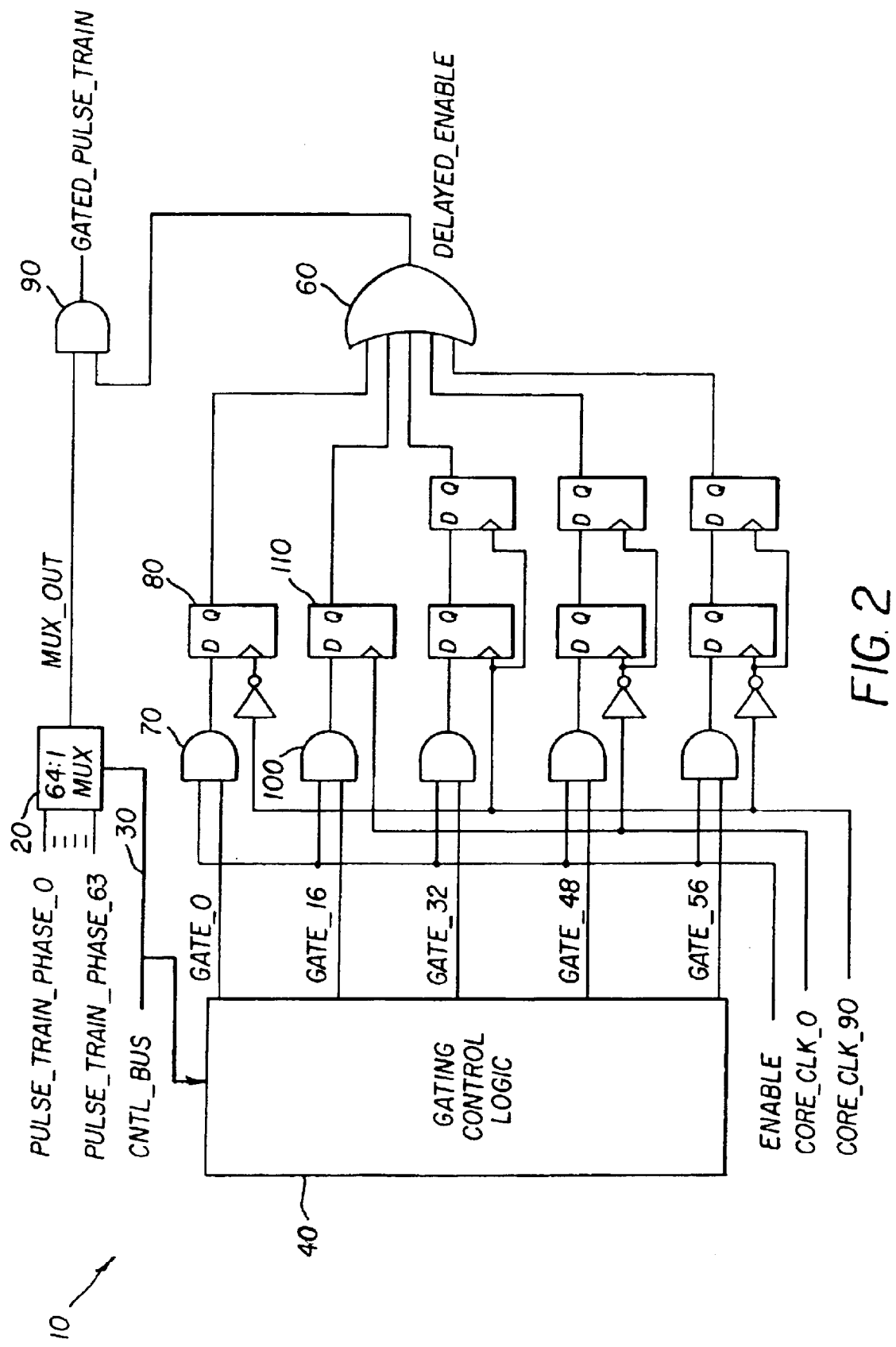
FIG. 2 is a logic diagram showing the logic used to create a gated pulse train of the present invention.

FIG. 2 shows delay logic 10 for an "ENABLE" signal which is generated externally for producing a "GATED_PULSE_TRAIN" signal. The control bus 30 is used by the multiplexer 20 to select a phase of the pulse train to be passed by the multiplexer 20, and is also used by the gating control logic 40 to enable one of the delay paths (Gate 0, Gate 16, Gate 32, Gate 48 and Gate 56). It is instructive to note that only one of these paths is enabled, and the others are disabled and drive a logic 0 to the OR gate 60. The delay path from signal "GATE_0" uses AND gate 70 to allow the system enable signal to pass to flip-flop 80. The clock for flip-flop 80 is the falling edge of "CORE_CLK_90". This delays the system enable signal by ¾ of the clock period. The output of flip-flop 80 goes to OR gate 60 and then to AND gate 90 where the enabling and disabling of the selected pulse train phase is accomplished.

The delay path from signal "GATE_16" uses AND gate 100 to allow the system enable to pass to flip-flop 110. The clock for flip-flop 110 is the rising edge of "CORE_CLK_0". This delays the system enable by a full clock period and correspondingly delays the enabling and disabling of the selected pulse train at AND gate 90. By performing similar analysis of the delay paths for "GATE_32", "GATE_48", and "GATE_56" it is observed that the enabling and disabling at AND gate 90 is delayed by 1.25, 1.5 and 1.75 clock periods, respectively. It is noted that the flip-flops associated with these gates function substantially similar to flip-flops 80 and 110 to create the delays and will not be discussed in detail herein. It is noted that two flip-flops are in each path to create additional delay as those skilled in the art will readily recognize.

Figure 3:
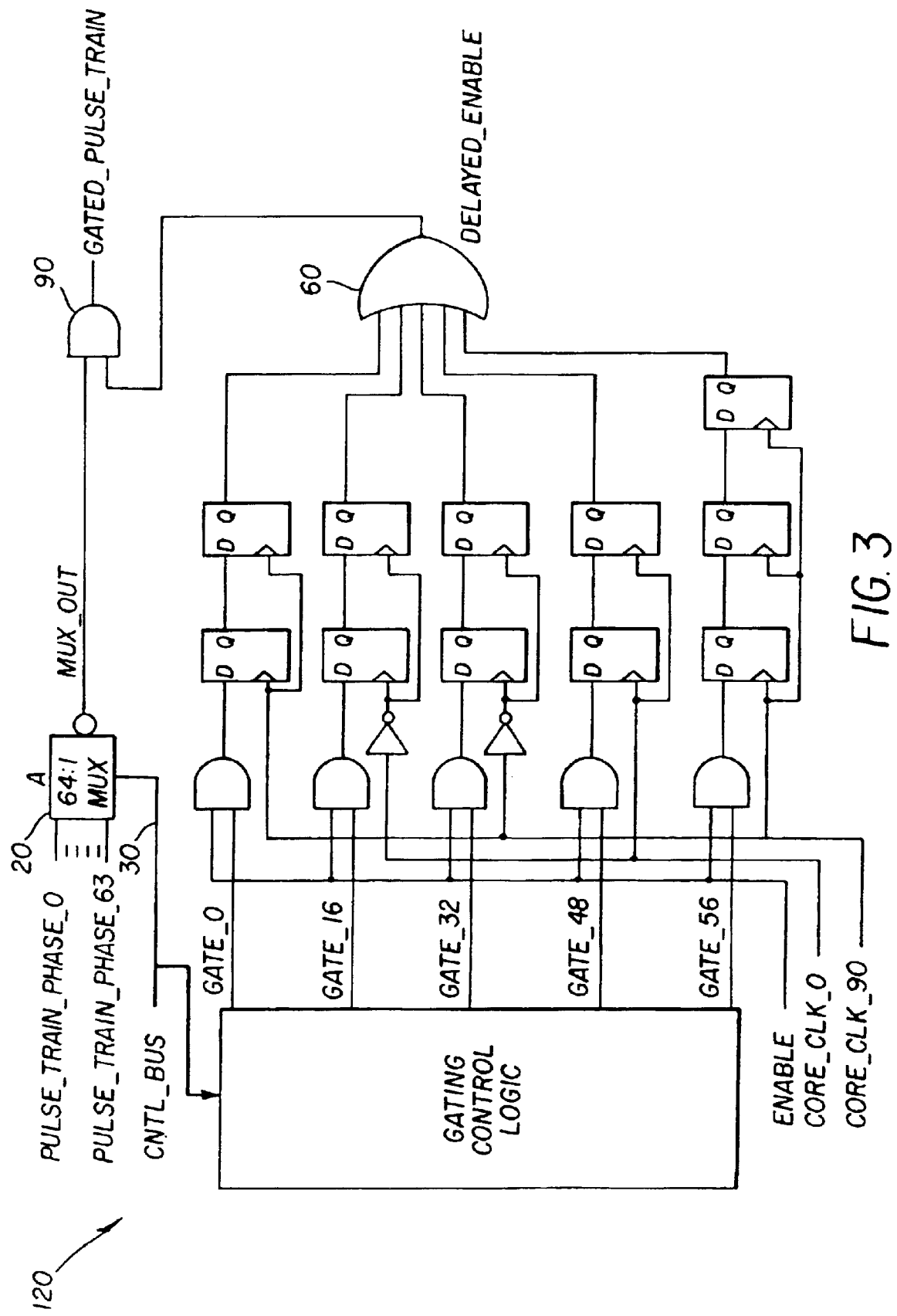
FIG. 3 is an alternative embodiment of FIG. 2.

FIG. 3 shows another delay logic 120 for an "ENABLE" signal which is generated externally for producing a "GATED_PULSE_TRAIN" signal. The logic herein is similar to FIG. 2 with the exception that the delay paths are as follows. The delays for signal paths "Gate_0", "Gate_16", "Gate_32", "Gate_48", and "Gate_56" are 1.25, 1.5, 1.75, 2, and 2.25 clock periods respectively. For clarity, similar components are used for the logic 20, 30, 60 and 90 in both FIGS. 2 and 3. For other components, those skilled in the art would readily recognize how the new delays are implemented with the flip-flops shown, and as a result, it will not be discussed in detail herein.

Figure 4:
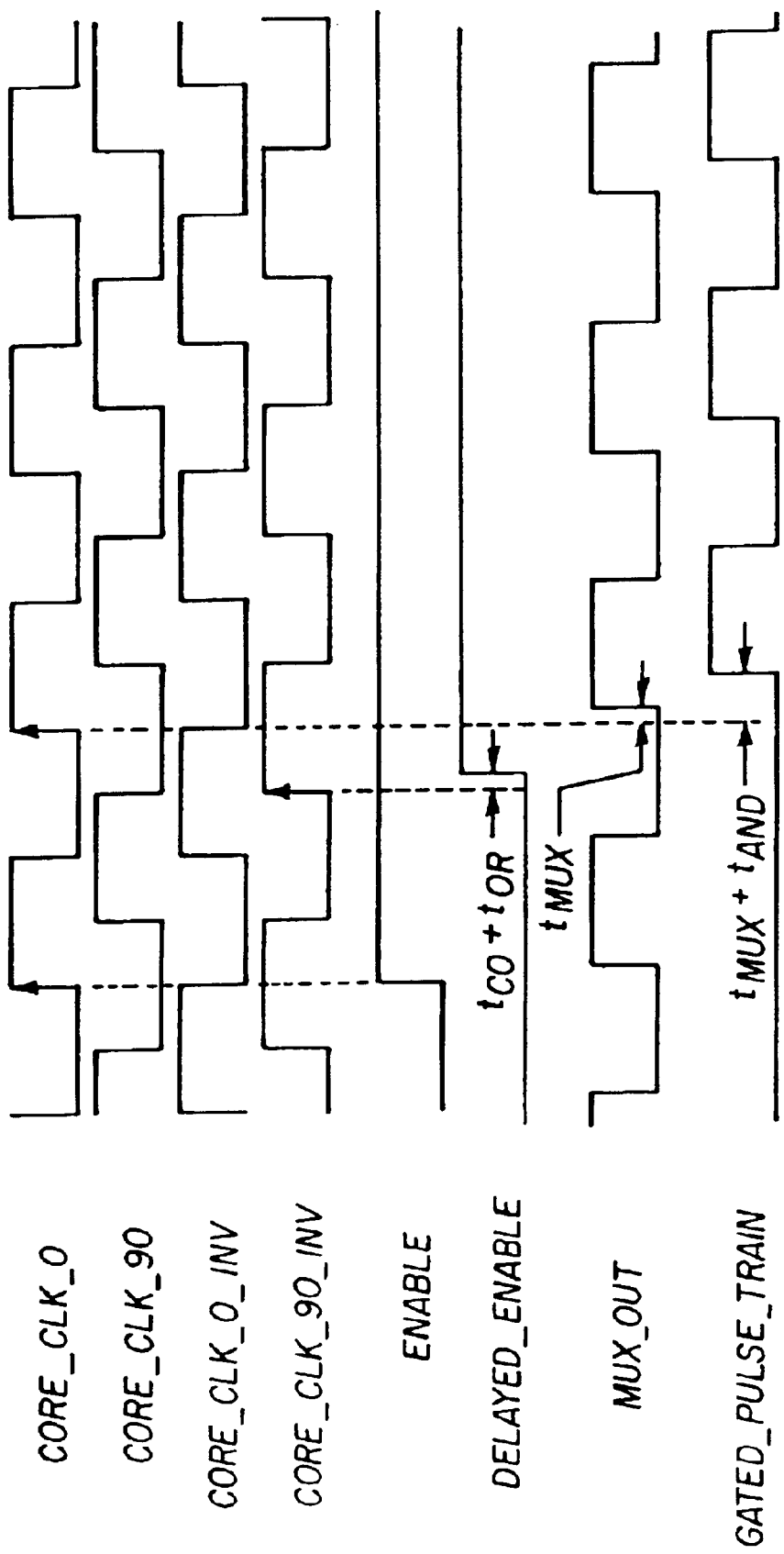
FIG. 4 is a timing diagram for FIG. 2.

FIG. 4 illustrates the timing for FIG. 2. The "ENABLE" signal is generated externally by clocked logic (not shown) using "CORE_CLK_0". In this example the "CNTL_BUS" value has resulted in the "GATE_0" signal path being selected by "GATING CONTROL LOGIC" 40. This results in creating a "DELAYED_ENABLE" signal which is delayed ¾ths of the clock period from "CORE_CLK_0". This causes transition of "DELAYED_ENABLE" at AND gate 90 to occur while signal "MUX_OUT" is low, thus precluding any shortened pulses or glitches when starting or stopping signal "GATED_PULSE_TRAIN".

The invention has been described in detail with particular reference to certain preferred embodiments thereof, but it will be understood that variations and modifications can be effected within the spirit and scope of the invention.

PARTS LIST

10 enable delay logic
20 multiplexer
30 control bus 40 gating control logic
60 OR gate
70 AND gate
80 flip-flop
90 AND gate
100 AND gate
110 flip-flop
120 another delay logic

What is claimed is:

1. A system that receives a plurality of periodic waveforms of varying phases and generates a gated periodic waveform, the system comprising:

(a) a selector electrically connected to a logic element for selecting one of the periodic waveforms from the plurality of periodic waveforms; and (b) an assembly for providing a delayed enable signal based on a phase of one of the periodic waveforms so that the gated periodic waveform is started and stopped without creating undesirable changes in the gated periodic waveform;

wherein the logic element generates the gated periodic waveform based on the delayed enable signal and the selected periodic waveform.

2. The system as in claim 1, wherein the generator generates a plurality of phases for the periodic waveform, and the assembly for providing the delayed enable signal receives phase information and creates the delayed enable signal based on the received phase information.

3. The system as in claim 1, wherein the selector is a multiplexer.

4. The system as in claim 1, wherein the assembly for providing the delayed enable signal includes a plurality of enabling logic elements for enabling a delay path from a plurality of delayed paths.

5. The system as in claim 4, wherein the plurality of delayed paths utilizes a plurality of clocks of predetermined phase with respect to a primary enable signal.

6. A method for generating a gated periodic waveform, the method comprising the steps of:

(a) generating a plurality of periodic waveform of varying phases;

(b) selecting one of the periodic waveforms from the plurality of periodic waveforms; and (c) providing a delayed enable signal based on a phase of one of the periodic waveforms so that the gated periodic waveform is started and stopped without creating undesirable changes in the gated periodic waveform; wherein a logic element generates the gated periodic waveform based on the delayed enable signal and the selected periodic waveform.

7. The method as in claim 6 wherein the step of providing the delayed enable signal includes receiving phase information and creating the delayed enable signal based on the received phase information.

8. The method as in claim 6 further comprising the step of providing a multiplexer as the selector.

9. The method as in claim 6, wherein the step of providing the delayed enable signal includes providing a plurality of enabling logic elements for enabling a delay path from a plurality of delayed paths.

10. The method as in claim 9, wherein the step of providing the plurality of delayed paths include utilizing a plurality of clocks of predetermined phase with respect to a primary enable signal.

* * * * *